March 24, 1964 K. M. HOALST 3,126,483

COMBINATION RADIATION DETECTOR AND AMPLIFIER

Filed Nov. 22, 1960

INVENTOR.
KAY M. HOALST,
BY
Charles P. Haughey
ATTORNEY.

United States Patent Office 3,126,483
Patented Mar. 24, 1964

3,126,483

COMBINATION RADIATION DETECTOR AND AMPLIFIER

Kay M. Hoalst, Torrance, Calif., assignor to Hughes Aircraft Company, Culver City, Calif., a corporation of Delaware

Filed Nov. 22, 1960, Ser. No. 71,066
6 Claims. (Cl. 250—83.3)

This invention relates to solid state radiation detection by use of semiconductors, and more particularly to a coupled detector diode and a transistor amplifier.

The measurement of radiation events by electronic current pulses resulting from ionization, or generation of electron-hole pairs, in semiconductor crystals requires measurement of pulses of very small amplitude and very short duration. Since semiconductor crystal detectors are charge devices, external capacitance must be held to a minimum to obtain a maximum voltage pulse from an incident radiation particle. Particularly the lead connections between a crystal detector and an implifier must be reduced to a minimum to reduce both capacitance and noise pickup.

In medical probe applications, wherein detectors may be inserted into a body for determining radiation therein, it is most important to avoid the noise pickup by leads which may completely obscure a signal pulse.

Ideally, the signal should be amplified before exposure to such noise pickup. It is also very important to have a small and compact detector for such insertion into the body. In such probes, a two foot length lead between a detector and an amplifier may pick up enough noise to mask a signal pulse from a 4.5 m.e.v. alpha particle generated pulse. In radiation detector mosaics, a series of detectors is arrayed to selectively detect radiation across an area, or volume. By suitable design of detector elements, a 99% or better coverage of the area by semiconductor crystal detectors may be obtained, with a minimum of loss of radiation between detectors. However, if individual detectors must be connected to separate amplifiers by lead wires, there is a serious problem in noise pickup, cross-talk effects between leads, and the like. By utilizing combination detector and amplifier crystal elements, lead wire connections between detector crystals and their associated amplifiers may be avoided.

Accordingly objects and advantages of this invention include reducing such undesired capacitance and noise pickup effects, providing a minimum size detector, and coupling detector and amplifier crystals to amplify signal pulses before they are obscured by such adverse effects.

The above and other objects and advantages of this invention will be apparent from the balance of this specification, disclosing the preferred embodiment of the invention, and in the accompanying drawings and claims forming a part thereof.

Figures 1, 2:
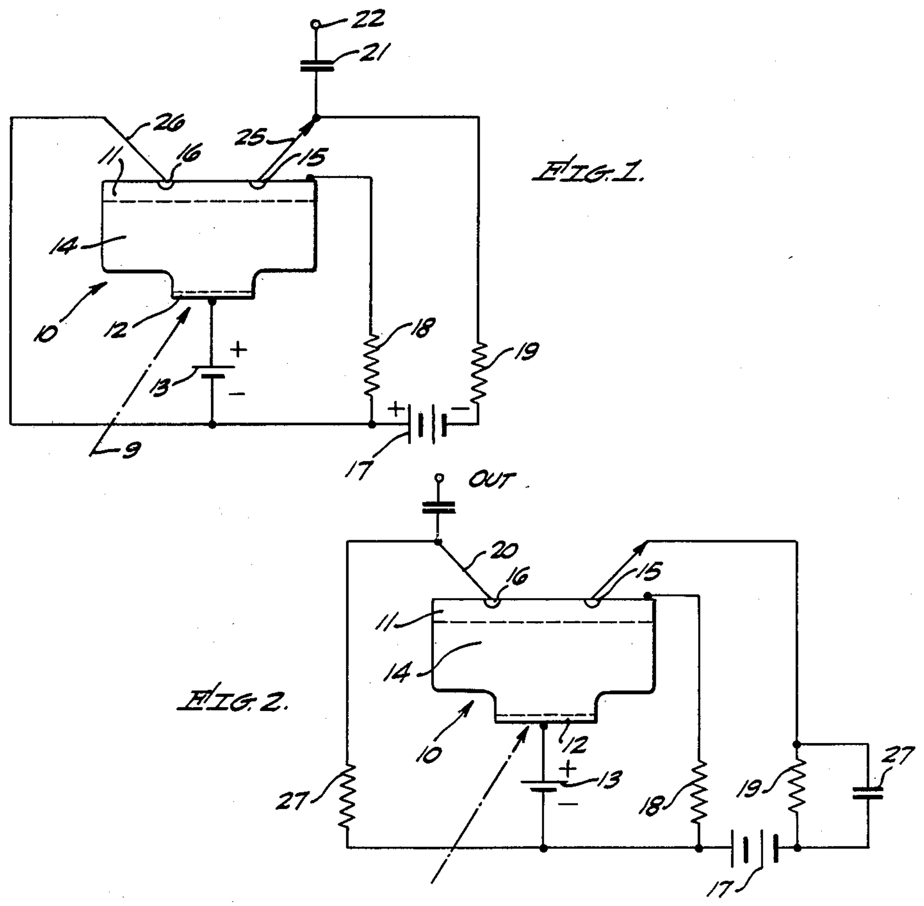
FIG. 1 illustrates a detector-amplifier crystal device and circuit of the emitter-follower type according to this invention.
FIG. 2 illustrates an alternate detector-amplifier crystal device and circuit of the collector follower type.

In the preferred example of this invention, according to FIG. 1, an NPN transistor configuration on one side of a silicon semiconductor radiation detector crystal device 10 has a base region 11 which also forms a part of an NP junction radiation detector diode having an incident-surface adjacent N region 12 to receive radiation on a path shown by arrow 9. The NP junction 11—12 is biased as by battery 13 to produce a deep depletion region 14, which may be considered as a solid state ion chamber.

The transistor portion of the crystal device 10 comprises the base region 11, an N-type emitter region 15 and an N-type collector region 16. The circuit of FIG. 1 includes a battery 13 which is of the order of 50 volts, battery 17 of 36 volts, resistors 18 and 19 of $10^6$ ohms and $5\times10^5$ ohms, respectively, and a coupling capacitor 21 of 1,000 $\mu\mu$farads. From a 4.5 m.e.v. alpha particle, a pulse use time of about .25 $\mu$sec., and decay of 1 $\mu$sec. is obtained, with an amplitude of about 7.5 mv. at the output 22.

The crystal device of FIG. 1 is preferably made from high resistivity semiconductor material, such as about 1,000 ohm-cm. silicon material, so that with a shallow surface N region 12 an effective depletion region 14 may be in excess of the range of the radiation particle to be measured. For a 4.5 m.e.v. alpha particle in silicon, 50 microns is adequate, although polyenergetic alpha radiation may fall between 4 and 9 m.e.v., requiring up to 100 microns of depletion region to capture the full energy of the particle in the region 14 and produce a maximum resultant current pulse. Suitable crystals of boron-doped silicon of 1,000 ohm-cm. resistivity may be used, and subjected to an N-type impurity material such as phosphorus to convert about 1 micron in depth of N-type region on the incident radiation surface 12. The incident surface 12 may be a mesa of reduced size, as shown, or may extend over substantially the entire crystal 10.

The emitter and collector regions 15 and 16 may be formed by pulse bonding, for example by pulsing electrodes 25, 26 of gold wire containing arsenic or antimony to the back side of the crystal 10, to form regrown N-type regions 15 and 16 which form emitter and collector regions of a transistor configuration. It is for some cases preferred to increase the P-type doping level on the crystal surface opposite the incident radiation surface, prior to pulse bonding of electrodes 25, 26 to increase conduction between the emitter and collector, and to avoid extending the depletion region 14 to the back crystal surface. Such a P+ impurity doping may be obtained by coating gallium, indium, or aluminum, for example, on the back surface and diffusing inward. Such a P+ region will be a part of the base region 11 of the NPN transistor configuration 16—11—15 on the back side of the crystal 10.

The device above described is used in the circuit illustrated in FIG. 1 to detect and amplify radiation produced current pulses such as produced by monoenergetic alpha radiation with no substantial external or coupling capacity loss or masking due to noise.

FIG. 2 illustrates a collector follower circuit utilizing the crystal device 10 of FIG. 1, shifting the output 22 and the coupling capacitor 21 to the collector lead, adding a 50K ohm resistor 27 in the collector lead, and also adding a 1,000 $\mu\mu$farad capacitor in parallel with the resistor 19.

The circuits illustrated in FIGS. 1 and 2 may be used alternatively for impedance matching or a voltage gain stage.

Figure 3:
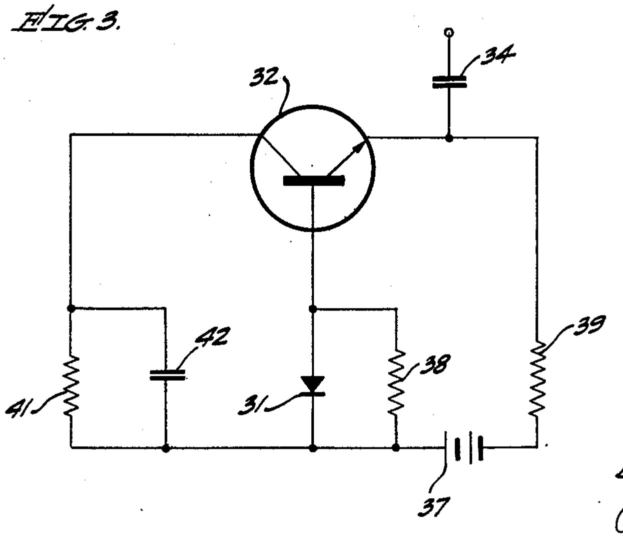
FIG. 3 illustrates a direct coupled detector crystal and transistor in an emitter follower circuit.

FIG. 3 illustrates an emitter follower circuit similar to that of FIG. 1 in which a separate radiation detector diode 31 and a power amplifying transistor 32 are directly coupled to amplify a radiation-produced pulse with substantially reduced loss of pulse and reduced noise. This circuit assists in understanding those of FIGS. 1 and 2. The diode 31 receives an incident particle, such as a 4.5 m.e.v. alpha particle, and under bias a pulse of current is obtained. That current pulse is transmitted directly to the base region of the transistor 32, shown here as an NPN transistor, wherein the pulse is delivered at amplified power to the output 33 through a coupling capacitor 34 of 1,000 $\mu\mu$farads. Bias for the system is produced by a battery 37, (which may be 36 v.) and resistance 38 of 1 megohm. A resistance 39 of 400K ohms is inserted between the battery and the emitter; and a resistance 41 of 3,000 ohms and a capacitor 42 of 0.1 $\mu$farads are inserted in parallel in the collector lead. This FIG. 3 circuit does not require the directly coupled diode and transistor base to have the same impurity type regions as in the case of FIGS. 1 and 2, and is accordingly somewhat more versatile, but is subject to the disadvantages of larger size, greater complexity, and added capacity and noise effects of the coupling.

It should be understood that the crystal detectors 10 or 31 will ordinarily use a highly doped thin surface impurity region (illustrated in FIGS. 1 and 2 as N-type regions 12) as incident radiation surface regions; however, when sufficient bias is used to extend the depletion region 14 substantially to the back surface of the crystal, radiation may be detected from the back side. It is only necessary that there is no substantial loss of energy from an incident particle prior to penetration to the depletion region. This is generally satisfied with the depletion region extending to within about 1 micron, or one diffusion length, of the incident radiation surface.

Figure 4:
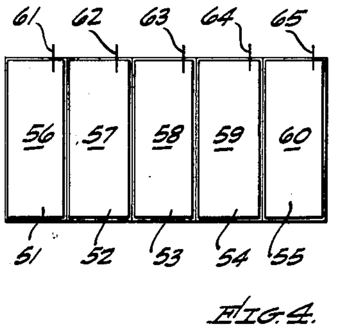
FIG. 4 illustrates a mosaic of detector crystals according to this invention.

FIG. 4 shows a linear array of detectors 51, 52, 53, 54 and 55, each having an incident surface 56, 57, 58, 59 and 60 exposed to the radiation to be measured. The surface PN junction bias is supplied through leads 61, 62, 63, 64 and 65 together with other circuitry not shown, which for each detector crystal may be as shown, for example, in FIG. 1. Such an array, or mosaic, of detectors may be used to measure a spectrum of radiation from a collimated source under a known field influence. Deflection in the path of a particle will determine which of the detector crystals receives the radiation. Suitable instrumentation may be supplied to display or record the pulses from radiation selectively by individual crystal detector.

By use of detectors according to the teachings of FIGS. 1 and 2, pulse signals are amplified before leaving the crystals, and stronger, clearer signals may be obtained.

What is claimed is:

1. A radiation detector semiconductor device having a relatively thick central intrinsic particle radiation energy receiving zone under electrical bias; first and second conductivity type boundary zones forming opposed bounds of said intrinsic zone; ohmic contacts to each of the boundary zones for applying bias thereto; and first and second rectifying contacts to the other of said boundary zones for connection to an amplifying circuit.

2. A detector according to claim 1 wherein the intrinsic zone is at least 50 microns in thickness under bias.

3. In a circuit for measuring the energy in incident radiation particles wherein a semiconductor detector crystal having an intrinsic zone under reverse bias between opposed zones of opposite electrical conductivity types is exposed to particle radiation, the improvement which comprises first and second rectifying contacts to one of said opposed zones coupled to an amplifier circuit in a manner to amplify the voltage of the electrical pulse induced in the intrinsic zone by such particles before the pulse leaves the crystal wherein the pulse is generated.

4. A circuit according to claim 3 wherein the intrinsic zone is at least 50 microns in thickness.

5. A circuit according to claim 3 wherein the detector crystal comprises an incident particle surface of a thickness of the order of one micron or less of relatively low resistivity and an intrinsic zone of relatively high resistivity.

6. A circuit for measuring the energy in incident radiation particles having a semiconductor detector crystal formed of bulk crystal material of at least 1000 ohm centimeter resistivity of one type electrical conductivity, an incident particle surface zone of opposite conductivity type of the order of one micron thickness or less, ohmic contacts to said incident particle surface zone and said bulk material, means for applying reverse bias therebetween to produce an intrinsic zone, a pair of rectifying contacts to said bulk material opposite the incident surface, and an amplifying and detection circuit coupled to the rectifying contacts for measuring amplified current pulses therebetween corresponding to current pulses generated in the biased intrinsic zone.

References Cited in the file of this patent

UNITED STATES PATENTS

| | | |
|---|---|---|
| 2,670,441 | McKay | Feb. 23, 1954 |
| 2,753,462 | Mayer et al. | July 3, 1956 |
| 2,843,748 | Jacobs | July 15, 1958 |
| 2,927,204 | Wilhelmsen | Mar. 1, 1960 |
| 2,975,286 | Rappaport et al. | Mar. 14, 1961 |
| 2,991,366 | Salzberg | July 4, 1961 |
| 2,992,337 | Rutz | July 11, 1961 |